United States Patent [19]

Centa

[11] 4,124,384

[45] Nov. 7, 1978

[54] IMAGE REPRODUCTION PROCESS USING SUBLIMABLE COLORANTS AND PHOTOHARDENABLE LAYERS

[75] Inventor: John M. Centa, Wilmington, Del.

[73] Assignee: E. I. Du Pont de Nemours and Company, Wilmington, Del.

[21] Appl. No.: 766,374

[22] Filed: Feb. 7, 1977

[51] Int. Cl.[2] .......................... G03C 7/16; G03C 7/00; G03C 5/04; D06P 00/00

[52] U.S. Cl. .......................................... 96/14; 8/2.5 A; 96/2; 96/27 r

[58] Field of Search .................. 96/2, 14, 27 R, 29 D; 8/2.5 A

[56] References Cited

U.S. PATENT DOCUMENTS

| | | | |
|---|---|---|---|
| 3,275,437 | 9/1966 | Cohen | 96/29 D |
| 3,363,557 | 1/1968 | Blake | 101/470 |
| 3,649,268 | 3/1972 | Chu et al. | 96/27 R |
| 3,854,950 | 12/1974 | Held | 96/82 |
| 3,952,131 | 4/1976 | Sideman | 428/334 |
| 4,007,372 | 2/1977 | Lenhard et al. | 250/317 |
| 4,059,471 | 11/1977 | Haigh | 156/244 |

FOREIGN PATENT DOCUMENTS

| | | |
|---|---|---|
| 2,450,500 | 5/1976 | Fed. Rep. of Germany. |
| 1,223,330 | 6/1960 | France. |

*Primary Examiner*—Richard L. Schilling

[57] ABSTRACT

Process for forming at least a single color image on a receptor material using photohardenable elements which contain one or more imagewise photohardenable layers toned with a toner material comprising a sublimable dye or mixture of dyes, the process comprising heating for at least 5 seconds, while in contact with a receptor material, either the toned element, the receptor material, or both, to a sublimation temperature of said dye and thereby cause at least a portion of the dye to sublime imagewise and condense on the receptor material. The temperature should not degrade the receptor or photohardenable layer. At least one non-imagewise exposed photohardenable layer may be present in the toned element. The process is useful in forming color proofs or proposed fabric patterns, color prints, projector overlays, etc.

16 Claims, 1 Drawing Figure

8 7 6 6 5 4 3 2 3 1 HEAT

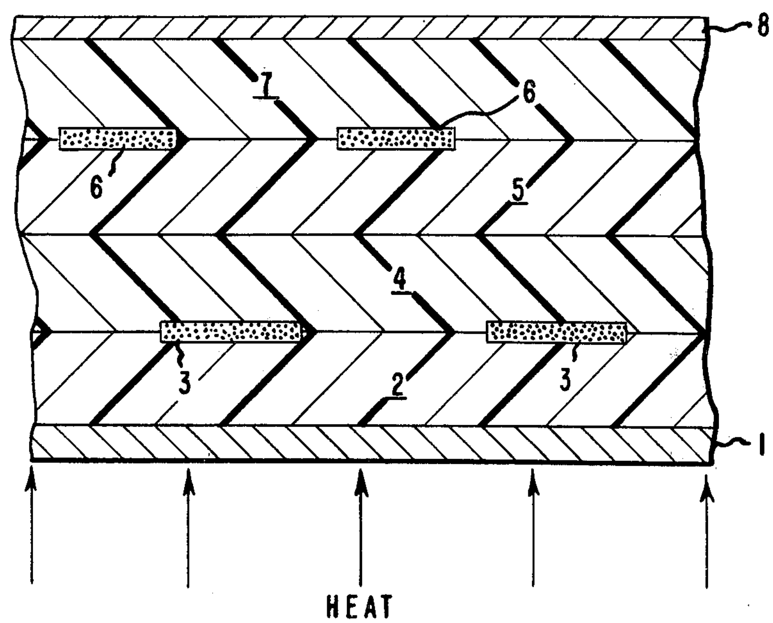
8
7
6
6
5
4
3
2
3
1
HEAT

IMAGE REPRODUCTION PROCESS USING SUBLIMABLE COLORANTS AND PHOTOHARDENABLE LAYERS

BACKGROUND OF THE INVENTION

1. Field of The Invention

This invention relates to an image reproduction process, and more particularly to a process for thermally transferring images from a photohardenable image bearing element to a receptor material.

2. Description of The Prior Art

Printing using sublimable colorants has been known and used for many years. One such process, known as heat transfer printing uses subliming dyes for coloring various materials such as synthetic fabrics. In another process printing is accomplished by means of sublimable dyes contained in a resinous binder on a paper transfer sheet. Each of these processes prints on an intermediate receptor followed by transfer to the final receptor material.

U.S. Pat. No. 3,649,268 discloses still another process wherein name plates are produced by fixing a sublimable dye on a sheet of anodized aluminum. The dye is applied as a toner on the surface of an imagewise exposed photopolymerizable layer coated on an anodized aluminum sheet. Toner adheres to the non-photopolymerized areas of the surface and is removed from the polymerized areas. Upon heating of the toned surface for several minutes at 200° C., it is found that the sublimable dye diffuses through the unpolymerized areas and stains the surface of the aluminum. By this process only a single color image can be produced and extreme care must be taken not to disturb or interfere with the toned surface which is unprotected.

SUMMARY OF THE INVENTION

In accordance with this invention an improved process for forming at least a single color image on a receptor material is provided using a photohardenable element, said process comprising the steps of:

(a) exposing imagewise to actinic radiation a photohardenable element having a photohardenable layer to form imagewise tacky and non-tacky areas in the layer;

(b) toning the tacky areas of the layer by applying and adhering thereto a toner material comprising a heat transferable, sublimable dye or mixture of dyes;

(c) laminating a photohardenable layer over the toned surface and photohardening said layer by nonimagewise exposing to actinic radiation;

(d) placing the photohardened surface in contact with the surface of a receptor material;

(e) heating for at least 5 seconds either the toned element, the receptor material, or both, while in contact to a temperature at which at least some of the dye sublimes and imagewise condenses on the receptor material, the temperature being below that which would melt or otherwise degrade either the photohardenable layer or the receptor material; and (f) removing the toned element from the receptor material.

Multicolor images on a receptor material using a multiple, colored, photohardenable element can be easily provided by a process comprising the steps of:

(a) applying a photohardenable layer on a carrier material;

(b) exposing imagewise to actinic radiation the photohardenable layer to form imagewise tacky and nontacky areas;

(c) toning the tacky areas of the layer by applying and adhering thereto a toner material comprising a heat transferable, sublimable dye or mixtures of dyes;

(d) repeating steps (a) to (c) one or more times, each time applying a photohardenable layer on the preceding layer and using a different color toner;

(e) placing the multicolored toned element in contact with the surface of a receptor material;

(f) heating for at least 5 seconds either the toned element, the receptor material, or both, while in contact to a temperature at which at least some of the dye sublimes and imagewise condenses on the receptor material, the temperature being below that which would melt or otherwise degrade either the photohardenable layer or the receptor material; and (g) removing the toned element from the receptor material.

BRIEF DESCRIPTION OF THE DRAWING

The FIGURE is a cross-section of a multiple colored element in position for heat transfer of the image to a receptor material.

DESCRIPTION OF THE PREFERRED EMBODIMENTS

The process of this invention advantageously uses an image reproduction system which employs photohardenable elements, including photopolymerizable elements, to modulate adherence of the image readout colorant to the imaging layer(s). Such systems are known. A typical system is described in U.S. Pat. No. 3,854,950, the disclosure of which is incorporated by reference. The photohardenable elements comprise a layer of photohardenable composition on a removable support. Over the surface of the photohardenable layer opposite the support can be present a removable cover sheet which is less strongly adherent at room temperature to the photohardenable layer than is the base support.

In practicing a process of this invention, a colored image is produced on a receptor material as follows:

(1) On a carrier material, which can be paper, film, metal sheet or preferably the smooth side of cast-coated one side cover paper, such as Kromekote® manufactured by The Champion Paper Division of Champion International, is laminated a photohardenable layer which had been coated on a transparent removable support.

(2) Following lamination, the photohardenable layer is exposed imagewise through the transparent removable support. Preferably, such exposure occurs in a vacuum frame, as is common in the printing industry, to assure intimate contact between the transparency image and the sample to be exposed. The photohardenable layer exhibits a different degree of tackiness following exposure to actinic radiation.

(3) Following exposure, the transparent support is removed and discarded.

(4) Using any of the techniques known in applying toner material and toning the surface of a color proofing film, as for example is disclosed in U.S. Pat. No. 3,060,024 or in U.S. application Ser. No. 710,102, filed July 30, 1976, now abandoned, a toner comprising a sublimable dye which sublimes at a moderate to fast rate, preferably at a temperature between 120° C. to 220° C., is applied onto the exposed surface. The process may be operable, however, in the temperature range of 60° to 300° C. The toner adheres preferentially onto the tacky areas of the surface and is wiped off the non-tacky sections.

Typical dyes, which may be used pure as toners, or combined with a resin matrix carrier, are the dyes classified in the Colour Index under the general title "Disperse dyes". Chemically, these dyes for the most part belong to one of the three following classes:

(a) Nitroarylamines
(b) Azo, and
(c) Anthraquinone.

They generally contain an amino group, with or without substituents and do not contain a solubilizing sulfonic group. The following is a non-exclusive list of commercially available disperse dyes useful in the practice of this process by trade name as well as the manufacturer of each.

Acetamine dyes (E. I. du Pont de Nemours & Co.)
Acetoquinone dyes (Francolor)
Celliton dyes (B.A.S.F.)
Artisil dyes (Sandoz)
Cibacete dyes (Ciba)
Setacyl dyes (Geigy)
Dispersol-Durand dyes (I.C.I.)
Esteroquinone dyes (Francolor)
Latyl Dyes (E. I. Du Pont de Nemours & Co.)
Foron Dyes (Sandoz)
Palanil Dyes (B.A.S.F.)
Resoline Dyes (Bayer)

Other suitable dyes will be found in U.S. Pat. No. 3,508,492 and the patents referred to therein.

In a preferred embodiment, the toner material used is a disperse dye dispersed in a resin matrix, e.g., cellulose acetate, cellulose acetate butyrate, polyvinyl chloride, polystyrene, polymethyl methacrylate, etc., said toner having a size distribution within the range 0.2 to 30 microns and not more than 50% of the particles being less than one micron equivalence spherical diameter. Preferably, more than 50% of the particles will have a size of 1 to 10 microns to limit background staining as taught in U.S. Pat. No. 3,620,726.

(5) Subsequent to the application of the toner material to the imaged surface, it is preferred that an additional element comprising a layer of photohardenable material on a transparent removable support be laminated over the toned surface. The laminated element is then exposed to actinic radiation for a longer period of time than the imagewise exposure. Typical exposure times are 10 times the imagewise exposure or more. The transparent support is then removed from the exposed element and is discarded.

(6) In the production of multicolored images, the process is repeated as many times as there are desired colors, each time using a different transparency and toner. For a typical four color reproduction, the first step may be to generate the black layer through steps (1) through (4) above, then repeat steps (1) through (4) three more times to overlay the cyan, yellow, and magenta layers, finishing with step (5). In some instances multicolor reproductions can be produced from a single photohardenable layer. The image must be one that permits a tacky area to be toned with one toner and one or more other tacky areas to be toned with different color toners without overlap of toner.

The FIGURE illustrates a typical two color proof ready for the heat transfer step. On a paper carrier material 1 is present a first image bearing photohardenable layer 2 which is imagewise exposed to provide imagewise tacky and non-tacky areas on the layer 2. Toner 3 comprising a sublimable dye is adhered to the tacky areas of layer 2. Over the first photohardenable layer is an intermediate photohardenable layer 4 which is non-imagewise exposed and polymerized. Intermediate layer 4 protects the toned surface of layer 2. A second image bearing photohardenable layer 5 which is imagewise exposed to provide imagewise tacky and non-tacky areas on the layer is present on intermediate layer 4. Toner 6 comprising a sublimable dye different in color from Toner 3 is adhered to the tacky areas of layer 5. A final outer photohardenable layer 7 which is non-imagewise exposed and polymerized is present over toned layer 5. The element is in contact with a receptor material 8 to which the two color image is transferred upon the application of heat sufficient to sublime the dyes on toners 3 and 6.

(7) The prepared color proof is placed in contact with the surface of the receptor material to which it is desired to heat transfer the image. Pressure and heat are then applied for a brief period of time at the end of which both the pressure and heat are removed and the proof and receptor material are separated. Surprisingly, it is observed that the sublimable dyes have diffused through the various imagewise exposed areas of the photohardenable layers, including the non-imagewise exposed barrier layers and have transferred imagewise to the receptor material. Where a multilayered multicolored proof is used, the resulting image is a multicolored reproduction of the original exhibiting excellent color balance and resolution.

While the amount of pressure employed is not critical, there is a minimal amount of required pressure (M.R.P.) to assure good transfer, above which the effect of transfer pressure ceases to be a color density variable. Such M.R.P. varies with the type and texture of the receptor material and is determinable experimentally as follows:

(a) A transfer is made starting with the lowest pressure ($P_1$) setting and a reading is taken of a solid area using a densitometer ($D_1$).

(b) The pressure is increased to a higher setting $P_2$ and maintaining the transfer time and temperature constant a second transfer and reading are effectuated resulting to a second density value $D_2$.

(c) The process is repeated until $D_n = D_{n+1}$ at which point the M.R.P. has been determined. In practice, the M.R.P. may vary, for example, from 0.5 to 3.0 psi (0.035 to 0.21 kg/sq.cm.) depending on fabric construction or surface texture of the receptor material and transfer equipment, for a given dwell time and temperature.

It is believed that upon application of the heat (i.e., through a heating platen or drum) to the Kromekote ® paper and photohardenable layers, the following occurs resulting in the dye transfer onto the receiving surface.

(1) The temperature of the paper, photohardenable layers and receptor material rapidly approach the temperature of the heating platen or drum.

(2) With increased temperature, the vapor pressure of the sublimable disperse dye increases and a dynamic equilibrium is established between the dye vapor flow rate, to and from the solid dye crystals in the toner, through the exposed photohardenable layers, the paper carrier and the dye vapor above the paper surface.

(3) The sublimation process continues until the dye vapor atmosphere above the paper reaches supersaturation, at which point the supersaturation is relieved by vapor condensation on the surface of the receptor material.

(4) As soon as this dye concentration gradient is set up on the surface of the receptor material, the process of molecular diffusion of the dye into the interior of the receptor material begins.

(5) This dye transfer mechanism of sublimation, supersaturation, and condensation proceeds in a state of dynamic equilibrium until the partial vapor pressures of the dye vapor over the printed paper and over the receptor material reach equilibrium. Typical transfer times, while dependent on the particular dye and temperature of transfer, as well as on the nature and texture of the carrier and receiving elements vary between 5 seconds and one minute or more. The method described above, used for determining M.R.P., may also be used at a fixed pressure and temperature to experimentally determine the optimum transfer time in a particular case.

Suitable receptor materials are those which accept a sublimable dye. Such materials may have a surface comprising polymer organic compounds, which can be in the form of plastic foils, synthetic fibers, or treated natural fibers and fibers having a synthetic outer layer. Metal surfaces also make useful receptors but must accept the dye, e.g., be porous. Especially useful are homo- or copolymers of vinyl acetate, vinyl alcohols, vinyl chloride, vinylidene chloride, acrylic acid compounds, alkylenes, alkylene-carboxylic acids and -esters, styrene, α-methyl styrene, maleic acid compounds, cellulose esters and ethers such as ethyl cellulose, benzyl cellulose, cellulose propionate, or -acetobutyrate, polyesters of terephthalic acid, carbonic acid, adipic acid, as well as polyamides. Typical commercially available materials include nylon 6 or 66, Perlon®, Orlon®, Dralon®, Dacron®, Terylene®, etc.

Heat transfer images produced by the process of the invention show excellent image quality and color printing. Resolution and print quality is comparable to images produced by high quality printing; however, the preparation of a printing plate, or a number of printing plates in the case of multiple color images, has been eliminated. Registration problems incident to sequential printing are absent, since the multicolored image is produced directly on the photohardenable element, and all colors are transferred simultaneously. The sophisticated technology incident to color proofing is advantageously exploited resulting in a practical method to form color proofs or produce limited quantities of heat transferred prints on various receptor materials with a minimum of expense and effort.

Some of the applications contemplated for the process of this invention include color proofs of proposed fabric patterns and specialty packaging products on films or foils, novelty items, e.g., color printed card table tops, color prints, designs, nameplates on film covered metals, cartographic transfers, overlays for overhead projectors, advertising slogans on fabrics, reflection and transparent display signs on a variety of rigid and flexible supports.

EXAMPLES OF THE INVENTION

The following examples illustrate this invention.

EXAMPLE 1

A photopolymerizable element similar to that described in Example II of U.S. Pat. No. 3,854,950, hereinafter referred to as a color proofing film, was prepared having a 0.0003 inch (~0.00076 cm) photopolymer layer coated on a 0.0005 inch (~0.0013 cm) polyethylene terephthalate support, with the other side of the photopolymer layer covered with a 0.00075 inch (~0.0019 cm) polypropylene film as a cover sheet. As in Example II of U.S. Pat. No. 3,854,950 the cover sheet was removed and the photopolymer layer was laminated to Kromekote®, (cast coated on one side) paper carrier material. The laminate was placed in a vacuum frame with the photopolymerizable layer facing the exposure source. A transparency comprising a blue printer, separation, halftone positive was placed over the photopolymerizable layer, and following the application of vacuum for one minute, the laminate was exposed to actinic radiation for approximately 20 seconds.

The laminate was then removed from the vacuum frame and the polyethylene terephthalate support removed to expose the photopolymerizable layer laminated on the Kromekote® paper. Toner particles of processed Latyl® Blue BCN dye (C.I. disperse Blue 56) were applied over the exposed surface. The toner adhered to the non-exposed areas and was wiped off the exposed areas. Following toning, the toned layer was further exposed to actinic radiation to develop a hardened, non-tacky surface. The toned and hardened photopolymerizable layer was placed in contact with a Dacron® polyester fiber woven fabric. Heat and pressure were applied for 45 seconds, raising the temperature of the layer to about 220° C. The layer was then separated from the fabric. It was observed that a faithful mirror image reproduction of the transparency had transferred from the layer to the fabric. The image had good color density and image resolution. No texture change could be detected on the imaged areas of the fabric, indicating that substantially no polymer had transferred from the layer onto the fabric.

EXAMPLE 2

A multiple color image was produced on a Kromekote® paper carrier by repeating the laminating, exposing, toning and hardening steps three times and using a different color toner for each toning step. The following procedure and dyes were used.

(a) A color proofing film as described in Example 1 was laminated to a Kromekote® paper carrier, and the film was hardened by exposing to ultraviolet actinic radiation. The polyethylene terephthalate support sheet was removed and a second color proofing film was laminated over the hardened photopolymerizable first layer.

(b) A positive, yellow, half-tone separation transparency was placed over the laminate of step (a) in a vacuum frame. Vacuum was applied for 1 minute, then the laminate was exposed through the transparency for 20 seconds to ultraviolet radiation.

(c) The exposed laminate of step (b) was removed from the vacuum frame, the polyethylene terephthalate support was removed, and the exposed photopolymerizable layer was toned with processed Latyl® Yellow 3G dye (CI Disperse Yellow 54).

(d) A third color proofing film was laminated over the Yellow-toned layer, and similarly exposed in a vacuum frame to ultraviolet radiation through a magenta, halftone, positive transparency. The exposed laminate was then toned as before with processed Latyl® Cerise N (C.I. Disperse Red 60).

(e) A fourth color proofing film was laminated over the magenta-toned layer and the exposure process was repeated using a cyan, halftone, positive transparency. Processed Latyl ® Blue BCN (C.I. Disperse Blue 56) was used as toner for this layer.

(f) A fifth color proofing film was then laminated over the cyan-toned layer, and was exposed uniformly to ultraviolet radiation in the vacuum frame without an image transparency to generate a hardened, non-tacky protective layer over the toned layers.

(g) The polyethylene terephthalate support was removed and the toned laminate was placed in contact with a receptor material consisting of a piece of woven Dacron ® fabric. The combination was subjected to heat of 220° C. and sufficient pressure to maintain good contact between fabric and toned laminate for 60 seconds, whereupon the heat and pressure were removed. The fabric was observed to bear a multicolored mirror image of the original which exhibited good resolution, good color balance and good saturation.

When the time for heat transfer was increased to 90 seconds, the transferred image exhibited excellent color saturation, with no deterioration in the color balance or resolution.

EXAMPLE 3

A color proofing film was laminated to Kromekote ® paper as in Example 1 above. It was subsequently placed in a vacuum frame with a halftone transparency over it, and vacuum was applied for a period of one minute. The photopolymerizable layer was exposed through the test transparency to ultraviolet radiation for 20 seconds whereupon the laminate was removed from the vacuum frame and the polyethylene terephthalate cover sheet stripped off the exposed layer. An acrylic pad was first dipped in a container containing a toner material of dyed cellulose acetate having an average particle size between 1 and 10 microns. The dye used was Du Pont Latyl ® Yellow 3G (C.I. Disperse dye 54). The acrylic pad was then used to apply and distribute the toner over the exposed, photopolymerizable layer. Toner adhered to the unexposed areas of the image and was wiped off the exposed surfaces. A second color proofing film was laminated over the toned surface and the laminate placed in the vacuum frame, vacuum was applied for one minute and then the laminate was exposed to ultraviolet radiation for 400 seconds. The polyethylene terephthalate support was removed and the exposed laminate was placed in contact with a piece of Dacron ® fabric. Heat and pressure sufficient to raise the laminate temperature to about 200° C. were applied to the laminate for a period of 10 seconds at which time the laminate and fabric were separated. A good quality yellow mirror image of the original had transferred to the fabric.

EXAMPLE 4

A multiple color image was produced on Kromekote ® paper as follows: On a sheet of Kromekote ® paper was laminated a first color proofing film which was then placed in a vacuum frame and after a one minute vacuum application was exposed for 15 seconds through a black, separation, halftone transparency. The polyethylene terephthalate support was removed. Using the procedure described in Example 3, the photopolymerizable layer was toned with a dyed cellulose acetate toner wherein the dyes used were a combination of two dyes, a Sinclair and Valentine Brown Dye 50-1301-06 and a disperse blue dye (C.I. 14). The toned image had a generally black appearance.

A second color proofing film was laminated over the black, toned layer to provide a barrier layer between the black toned layer and subsequent layers. This barrier layer was non-imagewise exposed in a vacuum frame following a one minute vacuum application to ultraviolet radiation for a period of about 200 seconds, whereupon the exposed laminate was removed from the vacuum frame, the polyethylene terephthalate support was removed, and a third color proofing film laminated thereon.

The third color proofing film was exposed in a vacuum frame as described above through a cyan, halftone, separation transparency to ultraviolet radiation for 15 seconds. The polyethylene terephthalate support was removed. The exposed photopolymerizable layer was then toned as described in Example 3 using a cyan dyed, cellulose acetate toner wherein the dyes used were a combination of two dyes, a Sinclair & Valentine Blue dye No. 50-0305-06 and a disperse blue dye (C.I. 14).

The procedure was repeated and a fourth color proofing film was laminated over the third and exposed through a yellow, halftone, separation transparency. The exposed layer, again after removal of the support, was toned with a similar toner as described before, wherein the dye used was Latyl ® Yellow 3G (C.I. disperse dye No. 54). A fifth layer was then produced as described before, using a magneta, halftone, separation transparency and toner particles dyed through the use of disperse dyes (C.I. 17) and (C.I. 60). A final sixth layer was laminated over the toned laminate and was given a non-imagewise exposure for 400 seconds to provide a protective overlayer.

After stripping the polyethylene terephthalate support, the laminate was placed in contact with a Dacron ® fabric and heated to about 200° C. for 60 seconds. Upon separation, it was observed that a mirror image of the four color original had transferred to the fabric and that the transferred image exhibited excellent color balance and resolution. The cloth texture did not appear any different in the imaged and non-imaged areas.

EXAMPLE 5

A color proofing film of the type disclosed in U.S. application Ser. No. 583,456, filed June 3, 1975, now U.S. Pat. No. 4,019,821, granted Apr. 26, 1977, was used to produce a three color image following the process described in Example 4 above, but with the black layer and the barrier layer steps omitted. The cyan layer was exposed for 9 seconds, the yellow for 12 seconds, the magenta for 12 seconds and the protective overlayer for 80 seconds. The same blue, yellow, and magenta toners as in Example 4 were used. The final laminate was placed in contact with a piece of Dacron ® cloth and subjected to 200° C. for 60 seconds. The resultant image on cloth shows reasonable color balance and density.

EXAMPLE 6

Using the procedure described in Example 3, a single color image was produced on a Kromekote ® carrier. Without removing the polyethylene terephthalate support, the laminate was subjected to a temperature of 204° C. for 60 seconds under 3 psi (0.21 kg/sq.cm.) pressure in contact with a piece of Dacron ® cloth. Upon removal of the cloth and support, both bore a mirror image of the transparency.

EXAMPLE 7

Using the procedure described in Example 4, a multicolor image was produced on a Kromekote® carrier. The multicolor image was placed in contact with a piece of white nylon fabric and subjected to a temperature of 200° C. for 60 seconds. Color balance, image resolution and density of the multicolor image were satisfactory.

EXAMPLE 8

Using the procedure described in Example 4, a multicolor image was produced on a Kromekote® carrier. The multicolor image was placed in contact with a piece of white cellulose acetate fabric and subjected to a temperature of 177° C. for 90 seconds. Color balance, image resolution and density of the multicolor image were satisfactory.

EXAMPLE 9

Using the procedure described in Example 3, except that the cyan toner of Example 4 was used, a single color image was produced on a Kromekote® carrier. The image was transferred to a piece of preheated Dacron® fabric as follows:

1. The piece of Dacron® fabric was subjected for 30 seconds to a temperature of 204° C.

2. Simultaneously, the Kromekote® carrier was preheated for 10 seconds by means of hot air at about 65° C.

3. The imaged Kromekote® carrier was placed in contact with the preheated Dacron® fabric and subjected to a temperature of 204° C. for 5 seconds. A mirror image of the original was transferred to the fabric.

EXAMPLE 10

Using the procedure described in Example 3, except that the toner used was a crude ground dye Latyl® Yellow 3G (C.I. Disperse Dye 54), a single color image was produced on a Kromekote® carrier. The thermal transfer was to a piece of white Dacron® fabric at a temperature of 200° C. for 60 seconds. A mirror image of the original was transferred to the fabric.

EXAMPLE 11

Example 4 was repeated except that the receptor material was an unsealed anodized aluminum plate, about 0.125 inch (3.18 mm) in thickness. The four color laminate when placed in contact with the receptor was heated to about 200° C. for 120 seconds. Upon separation, it was observed that a mirror image of the four color original had transferred to the anodized aluminum. The transferred image exhibited excellent resolution and good color balance.

I claim:

1. A process for forming at least a single color image on a receptor material using a photohardenable element comprising a photohardenable layer on a carrier material, said process comprising the steps of:

(a) exposing imagewise to actinic radiation the photohardenable element to form imagewise tacky and non-tacky areas in the photohardenable layer;

(b) toning the tacky areas of the layer by applying and adhering thereto a toner material comprising a heat transferable, sublimable dye or mixture of dyes;

(c) laminating a second photohardenable layer over the toned surface and photohardening said second layer by non-imagewise exposing to actinic radiation;

(d) placing the photohardened surface in contact with the surface of a receptor material;

(e) heating for at least 5 seconds either the toned element, the receptor material, or both, while in contact to a temperature at which at least some of the dye sublimes and imagewise condenses on the receptor material, the temperature being below that which would melt or otherwise degrade either the photohardenable layer or the receptor material; and (f) removing the toned element from the receptor material.

2. A process according to claim 1 wherein the toner material is a disperse dye dispersed in a resin matrix, said toner having a size distribution with the range 0.2 to 30 microns and not more than 50% of the particles being less than 1 micron equivalence spherical diameter.

3. A process according to claim 2 wherein the toner is a disperse dye dispersed in cellulose acetate having an average particle size between 1 and 10 microns.

4. A process according to claim 1 wherein the toner material is a disperse dye.

5. A process for forming a multiple color image on a receptor material using a multiple colored, photohardenable element, said process comprising the steps of:

(a) applying a photohardenable layer on a carrier material;

(b) exposing imagewise to actinic radiation the photohardenable layer to form imagewise tacky and non-tacky areas;

(c) toning the tacky areas of the layer by applying and adhering thereto a toner material comprising a heat transferable, sublimable dye or mixture of dyes;

(d) repeating steps (a) to (c) one or more times, each time applying a photohardenable layer on the preceding layer and using a different color toner;

(e) placing the multicolored toned element in contact with the surface of a receptor material;

(f) heating for at least 5 seconds either the toned element, the receptor material, or both, while in contact to a temperature at which at least some of the dye sublimes and imagewise condenses on the receptor material, the temperature being below that which would melt or otherwise degrade either the photohardenable layer or the receptor material; and (g) removing the toned element from the receptor material.

6. A process according to claim 5 wherein there is applied completely over at least one of said toned layers an intermediate photohardenable layer which is non-imagewise exposed to actinic radiation to form a protective layer over the toned photohardenable layer.

7. A process according to claim 6 wherein the exposed protective layer is present on solely the outermost toned photohardenable layer.

8. A process according to claim 6 wherein an exposed protective layer is present on each of the toned photohardenable layers.

9. A process according to claim 5 wherein the toner material is a disperse dye dispersed in a resin matrix, said toner having a size distribution with the range 0.2 to 30 microns and not more than 50% of the particles being less than 1 micron equivalence spherical diameter.

10. A process according to claim 9 wherein the toner is a disperse dye dispersed in cellulose acetate having an average particle size between 1 and 10 microns.

11. A process according to claim 5 wherein the toner material is a disperse dye.

12. A process according to claim 5 wherein each of said photohardenable layers is a photopolymerizable layer containing at least one free radical initiated, chain propogating, addition polymerizable compound containing at least one terminal ethylenic group, and an addition polymerization initiator activatable by actinic radiation.

13. A process according to claim 12 wherein each of said photopolymerizable layers contains a compatible macromolecular organic polymer binder.

14. A process according to claim 5 wherein the receptor material is a synthetic fabric.

15. A process according to claim 14 wherein said fabric is nylon.

16. A process according to claim 14 wherein said fabric is a polyester.

* * * * *